United States Patent
Man et al.

(10) Patent No.: US 6,528,184 B2
(45) Date of Patent: Mar. 4, 2003

(54) COBALT-MOLYBDENUM-PHOSPHORUS ALLOY DIFFUSION BARRIER COATINGS

(75) Inventors: Hau-chung Man, Kowloon (HK); Wing-yan Ng, Kowloon (HK); Chi-hung Yeung, Kowloon (HK); Chi-yung Lee, Kowloon (HK); Cho-lung Siu, Kowloon (HK); Rick Y. C. Tsui, Kowloon (HK); Kinny L. K. Yeung, Kowloon (HK)

(73) Assignees: Hong Kong Polytechnic University, Kowloon (HK); Hong Kong Productivity Council, Kowloon (HK)

( * ) Notice: Subject to any disclaimer, the term of this patent is extended or adjusted under 35 U.S.C. 154(b) by 68 days.

(21) Appl. No.: 09/794,390

(22) Filed: Feb. 28, 2001

(65) Prior Publication Data

US 2002/0155315 A1 Oct. 24, 2002

(51) Int. Cl.$^7$ .............................. B32B 15/01; C25D 3/12
(52) U.S. Cl. ................. 428/675; 428/672; 428/935; 428/936; 427/437; 205/176; 205/258
(58) Field of Search .................... 428/668, 675, 428/672, 935, 936; 427/437; 205/176, 255, 258

(56) References Cited

U.S. PATENT DOCUMENTS 5,614,003 A * 3/1997 Mallory, Jr. ............... 106/1.22

OTHER PUBLICATIONS

Derwent abstract for SU 261856A, May 29, 1967, one page.*

* cited by examiner

Primary Examiner—John J. Zimmerman
(74) Attorney, Agent, or Firm—Leydig, Voit & Mayer, Ltd.

(57) ABSTRACT

Techniques are provided for electrolessly depositing and electrodepositing a CoMoP barrier coating onto copper or copper alloys to prevent copper diffusion when forming gold layers on articles such as watch bracelets, watch cases, imitation jewellery, spectacle frames, and metal buttons.

15 Claims, 1 Drawing Sheet

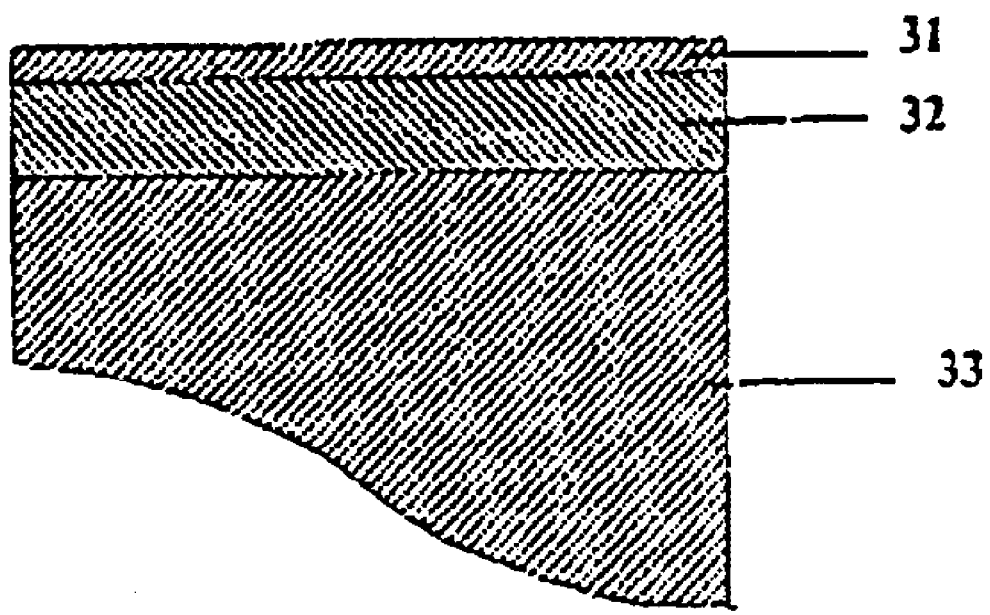

COBALT-MOLYBDENUM-PHOSPHORUS ALLOY DIFFUSION BARRIER COATINGS

BACKGROUND OF THE INVENTION

I. Field of the Invention

This invention generally relates to the use of a barrier coating to prevent the migration of copper in basis metal to overplate.

II. Description of the Prior Art

Jewellery products such as fashion watch bracelets, watch cases, imitation jewellery etc. are often made from copper or copper alloy. These products are often coated with fine gold or gold alloy. It is undesirable to deposit gold directly on copper or copper alloy. When gold is in intimate contact with copper or its alloys, a solid solution of gold-copper is formed. Copper will migrate in gold even at room temperatures. When copper atoms reach the gold top surface they react with atmospheric oxygen and tarnish the attractive appearance of these ornamental products.

To overcome this migration problem, a copper diffusion barrier layer is placed between the basis metal and the top gold coating. A number of high melting metals are known to be effective copper diffusion barriers, such as nickel, cobalt, chromium, tungsten, and molybdenum. Various factors have to be considered on the suitability of a metal to act as an effective diffusion barrier. The adhesive properties of gold overplate on the barrier coating, the capacity to reduce the thickness of the gold coating, volatility of the barrier coating on further treatments under high temperature and high vacuum; and its corrosion resisting properties are important elements for consideration of its suitability.

When these jewellery products are in prolonged contact with human skin during use, human perspiration penetrates the gold overplate and may corrode the diffusion barrier underneath to release metal ions as corrosion products. These corrosion products mix with the perspiration and may irritate the skin. The allergic effects of several metals used in plating has been studied and published. These results have been used as one of the references for the selection of diffusion barriers (see for example, "Reinst-Palladium als Ersatz fur Palladium/Nickel. Einsatz. fur Endschichten und als Diffusionssperre", K.-P. Beck, Glavanotcchnik, vol. 47, no. 1; 1993; pp.20).

Nickel has been widely used as the barrier coating for engineering applications. Until the implementation of the EEC Directive 76/769/EEC in 1994 controlling the use of nickel in consumer articles and the liberation of nickel(II) ions, it was also used as the barrier coating for jewellery products intended for prolonged contact with the skin (see, for example, "Control of nickel emission in jewellery and related items", R. V. Green and J. F. Sargent, Transactions of the Institute of Metal Finishing, vol. 75, no. 3; 1997; p. B51–52). The above mentioned Directive stipulates that metal objects with the intent for prolonged contact with human skin and made of nickel-containing alloys or coated with nickel-containing substances, should not release nickel (II) in excess of 0.5 $\mu g/cm^2$/week. The specifications for monitoring the release rate are documented in the standards, EN1811 and EN12471 adopted by the European Committee for Standardization (CEN) in late 1999.

Various barrier coatings have been suggested to replace nickel including chromium and palladium. Palladium is used to overcome the allergy problem but the cost of the metal can be prohibitive. Copper-tin alloy is another alternative but its internal stress properties and relatively high vapor pressure pose a lot of production problems.

SUMMARY OF THE INVENTION

The invention provides a barrier layer of cobalt-molybdenum-phosphorus, CoMoP.

The invention further provides a process for electrolytic depositing a cobalt-molybdenum-phosphorus alloy, which possesses excellent barrier property for copper. The use of this alloy as a barrier coating on copper or copper alloy base metal significantly inhibits the diffusion of copper atoms into the gold overplate at moderate temperatures over a long period of time and at high temperatures over a shorter period of time. It is a corrosion resistant alloy which can withstand corrosion on prolonged contact with the human skin.

The presence of cobalt in the alloy contributes to the inhibition of diffusion of copper. The presence of molybdenum in the alloy inhibits the corrosion of cobalt. It forms a passive film on the surface in the presence of an oxidizing agent such as oxygen in air, and protects the alloy.

The oxy salts of molybdenum are a potential replacement for chromium, especially the hexavalent ion function of chromium (see for example, "Molybdenum—A Corrosion Inhibitor", E. Groshart, Metal Finishing, January 1989; p53–54). Molybdenum cannot be deposited in aqueous solution because of its high overpotentials. However, it can be electrolytic and electrolessly deposited with iron groups elements.

The presence of phosphorus favors the formation of amorphous characteristics in the alloy. It reduces grain boundaries and inhibits corrosion. The introduction of phosphorus thus enhances diffusion barrier properties.

THE DRAWING

The accompanying FIGURE is a schematic section through an ornamental article prepared in accordance with this invention.

DETAILED DESCRIPTION

The brass substrate is prepared for the electrolytic deposition in the following manner. The total area of the workpiece is determined. It is degreased; it then undergoes ultrasonic emulsification and cathodic cleaning. These cleaning processes are conducted in accordance with methods known in the art. The workpiece is then subjected to an acid rinse of 10% sulfuric acid, rinsed in water, followed with acid copper electroplating. The acid activation and the acid copper electroplating processes are conducted with the methods known in the art.

The copper plated workpiece is activated in a 10% sulfuric acid bath, rinsed in water and immersed in a bath of the following composition:

| | |
|---|---|
| cobalt sulfate | 50–70, preferably 60 g/l |
| sodium molybdate | 25–45, preferably 35 g/l |
| sodium hypophosphite | 15–25, preferably 20 g/l |
| citric acid | 160–200, preferably 180 g/l |
| ammonia | to pH 3–4, preferably about 3 |

The baths having such compositions are also the subject of this invention.

The temperature of the bath is kept at 55–75° C., preferably 65–75° C., more preferably about 65° C. The workpiece is electroplated at current density 0.1 to 50 A/dm$^2$, preferably 6–40 A/dm$^2$, more preferably about 10 A/dm$^2$. Molybdenum alloys are well known for the relatively low hydrogen overpotentials during electrolysis. Thus, the electroplating efficiency of the said bath is about 30%. The rate of hydrogen evolution during electrolysis is so intense that the popular art of incorporating wetting agent during plating in order to avoid the formation of pitting, resulting from the formation of small hydrogen bubbles securely attached to the surface of the piece, can be eliminated The workpiece after plated with the thin coating of cobalt-molybdenum-phosphorus, is now ready for electrodepositing gold or other decorative coatings after prior activation with 10% sulfuric acid for 10 seconds.

After electroplating the workpiece for 5 minutes at electric current density of 6 A/dm$^2$, the coating is about 3 microns in thickness. The composition of the alloy coating is: 82% Co, 12% Mo and 6% P. A schematic cross-section of the finished article is shown in FIG. 1. A coating of an amorphous-microcrystalline alloy 32 of CoMoP is deposited onto the surface of a substrate 33. The coating impedes the migration of copper atoms to the top decorative gold or gold ally coating.

The workpiece is subjected heat in a hot air oven at 120$^2$C for 14 days or at 500° C. for 12 hours. Copper has not migrated to the surface of the alloy coating.

The coating consists of a mixture of microcrystalline and amorphous metal alloy of Co, Mo and P. The presence of Mo in the coating promotes the formation of a passive film, protecting the attack of Co in hostile environment, such as perspiration. Deposit with amorphous structure reduces intercrystalline boundaries, enhancing its capacity to resist corrosion. Workpiece coated according to the above mentioned technique was subjected to CASS corrosion test (ASTM B368) treatment for 24 hours. The coating was graded 9–10 according to the method described in ASTM B537. When the coated workpiece was subjected to artificial perspiration for 24 hours. The formulation of the artificial perspiration was formulated according to the recipe listed in the European Standard EN1811. The workpiece was graded 10 according to the grading system of ASTM B537 after the treatment of artificial perspiration.

At low temperatures, copper migrates through the barrier coating via crystal boundaries at a much faster rate than through the metal grains. In the amorphous state of the barrier coating, the amount of boundaries is greatly reduced, affecting the total amount of copper migrating to lower chemical potential regions. At high temperatures, intergranular migration dominates. However, the low solubility of copper atoms in cobalt reduces the total amount of migratory process even at high temperatures.

We claim:

1. A method of replacing nickel as a barrier layer on copper for decorative coating processes in manufacturing plated articles for prolonged contact with human skin, comprising:

electrolessly depositing on a substrate surface chosen from copper and copper alloys a ternary amorphous-microcrystalline cobalt alloy of cobalt, molybdenum, and phosphorus, from an aqueous bath, to produce a barrier layer to impede migration of copper atoms, wherein the bath comprises a molybdenum bath comprising sodium molybdate, cobalt sulfate, sodium hypophosphite, citric acid, and ammonia to adjust the pH of the bath to less than 4.

2. The method according to claim 1, wherein the bath has pH between 3–4.

3. The method according to claim 1 wherein the bath contains 25–45 g/l of sodium molybdate.

4. The method according to claim 3, wherein the bath contains about 35 g/l of cobalt sulfate.

5. The method according to claim 1 wherein the bath contains 50–70 g/l of cobalt sulfate.

6. The method according to claim 5, wherein the bath contains about 60 g/l of cobalt sulfate.

7. The method according to claim 1 wherein the bath contains 15–25 g/l of sodium hypophosphite.

8. The method according to claim 7, wherein the bath contains about 20 g/l of sodium hypophosphite.

9. The method according to claim 1 wherein the bath contains 150–200 g/l of citric acid.

10. The method of claim 9, wherein the bath contains about 180 g/l of citric acid.

11. The method according to claim 1 including depositing a glossy and ductile molybdenum alloy barrier coating on a base copper/copper alloy substrate comprising employing the bath with a direct electric current at a temperature of 55° C.–75° C.

12. The method according to claim 11, using a current density of 0.1–50 A/dm$^2$.

13. A method of preventing diffusion of copper to the surface of a gold plated article intended to have an aesthetic appearance, the method comprising depositing a cobalt-molybdenum-phosphorus alloy as a barrier layer on a copper face of the article and then plating with a gold-containing coating.

14. A gold-plated consumer article of copper with a barrier layer to prevent migration of copper to a gold plating, said barrier layer comprising a cobalt-molybdenum-phosphorus alloy.

15. An imitation gold article selected from a watch bracelet, a watch case, an item of imitation jewellery, a pair of spectacle frames, and a metal button, said article having a copper substrate coated with a cobalt-molybdenum-phosphorus alloy and overplated with a gold or gold alloy.

* * * * *